United States Patent [19]

Aoyama et al.

[11] Patent Number: 4,618,878
[45] Date of Patent: Oct. 21, 1986

[54] SEMICONDUCTOR DEVICE HAVING A MULTILAYER WIRING STRUCTURE USING A POLYIMIDE RESIN

[75] Inventors: Masaharu Aoyama, Fujisawa; Masahiro Abe, Yokohama; Takashi Ajima, Kamakura; Toshio Yonezawa, Kitakyushu, all of Japan

[73] Assignee: Kabushiki Kaisha Toshiba, Japan

[21] Appl. No.: 621,086

[22] Filed: Jun. 15, 1984

[30] Foreign Application Priority Data

Jun. 18, 1983 [JP] Japan ................. 58-108558

[51] Int. Cl.$^4$ ............................................. H01L 23/48
[52] U.S. Cl. ......................................... 357/71; 357/72; 357/54; 357/84; 357/4
[58] Field of Search ............... 357/71, 72, 54 N, 54 S, 357/84, 4

[56] References Cited

U.S. PATENT DOCUMENTS 3,926,914 12/1975 Miyadera et al. ............... 357/54 X
4,472,726 9/1984 DiMaria et al. .................. 357/4 X
4,507,333 3/1985 Baise et al. ...................... 357/54 X

FOREIGN PATENT DOCUMENTS 2401613 7/1975 Fed. Rep. of Germany .... 357/54 S
2027273 2/1980 United Kingdom ............. 357/54 N

OTHER PUBLICATIONS

Mukai et al, "Planar Multilevel Interconnection Technology Employing a Polyimide," *IEEE Jour. of Solid-State Circuits*, vol. SC-13, No. 4, Aug. 1978, pp. 462–467.

Alcorn et al, "Self-Aligned Silicon Nitride–Polyimide Double Step Via Hole," *IBM Tech. Discl. Bull.*, vol. 27, No. 7A, Dec. 1984, pp. 3990–3993.

*Primary Examiner*—Andrew J. James
*Assistant Examiner*—William Mintel
*Attorney, Agent, or Firm*—Finnegan, Henderson, Farabow, Garrett & Dunner

[57] ABSTRACT

A semiconductor device having a multilayer wiring structure which comprises a semiconductor substrate, a first wiring layer deposited on said substrate, and a second wiring layer deposited on said first wiring layer with insulating layers disposed therebetween, wherein the insulating interlayer consists of an inorganic insulating layer and a polyimide-based resin film overlying the inorganic insulating layer. The thickness ratio of the polyimide-based resin film to the inorganic insulating film ranges from 0.1 to 0.5. A method of manufacturing a semiconductor device of a multilayer wiring structure wherein an opening is formed in the insulating interlayer to have a small step.

7 Claims, 11 Drawing Figures

SEMICONDUCTOR DEVICE HAVING A MULTILAYER WIRING STRUCTURE USING A POLYIMIDE RESIN

BACKGROUND OF THE INVENTION (a) Field of the Invention

The present invention relates to a semiconductor device having a multilayer wiring structure and a method of manufacturing the same and, more particularly, to a highly reliable multilayer wiring structure which is free from disconnections and variations in its electrical characteristics, and a method of forming such a multilayer wiring structure.

(b) Description of the Prior Art

When the electrode wiring area increases as in highly integrated semiconductor devices, a multilayer wiring structure must be employed. However, conventional multilayer wiring techniques have the disadvantage of disconnecting and degrading the electrical characteristics which are caused by poor step coverage, thereby deminishing the reliability of a semiconductor device.

Wiring disconnections can be eliminated by flattening a step between an insulating film and an underlying electrode wiring layer, and making uniform the thickness and stress of an overlying electrode wiring layer which crosses over the underlying electrode wiring layer. At the same time, a simple etching technique must also be proposed to etch the insulating film to form an opening having moderately inclined wall surfaces so as to obtain a complete electrical connection between the underlying and overlying electrode wiring layers.

A conventional flattening technique is proposed wherein a dispersion obtained by dispersing and dissolving fine $SiO_2$ particles in an alcohol-based solvent is applied by a spin coater on a CVD-$SiO_2$ or PSG (phosphosilicate glass) film formed as an insulating interlayer on an underlying electrode wiring layer. The resultant structure is annealed at a temperature of 200° to 500° C., thereby forming a flattened silica film.

However, in the conventional method of forming the silica film on the CVD-$SiO_2$ or PSG film, it is difficult to obtain a silica film having a sufficient thickness to moderate the stepped portion, for example, a thickness of 0.2 to 0.3 µm in a single coating step. In addition to this disadvantage, the silica film has a low mechanical stength and tends to become cracked at an opening for depositing an electrode metal due to a difference in stress between the silica film and the electrode metal at the time of annealing. As a result, the yield of the semiconductor devices and the reliability of the wiring layers are low since electrical disconnections tend to occur in the multilayer electrode structure.

Another conventional flattening technique is known wherein a polyimide-based resin which has a stress releasing property with respect to the underlying layer and high heat resistance is coated by a spin coater and is baked to form an insulating interlayer of the polyimide-based resin film with a small step, thereby obtaining a multilayer wiring structure.

This conventional method using the polyimide resin has the advantage in that the insulating interlayer of 2 to 3 µm thickness required for the interlayer insulation can be applied by a single coating cycle. However, the polyimide resin has poor water-absorption resistance and humidity resistance. In particular, when a semiconductor device encapsulated in a compact plastic package is kept in operation for a long period of time, the electrical characteristics of the semiconductor elements such as a transistor formed on a substrate can vary, thus failing to assure sufficient reliability.

Still other conventional flattening techniques are also proposed. According to one technique, a part of an aluminum electrode wiring layer is subjected to anodic oxidation to flatten the electrode layer. According to another technique, after a flat organic film is applied to the surface of an inorganic insulating film, the films are sputter-etched under the conditions that both films are etched at an equal etching rates, thereby flattening the inorganic insulating film.

Any one of these conventional flattening techinques is more complicated as compared with the process wherein the silica film or the polyimide resin film is simply applied by the spin coater for forming an insulating interlayer.

SUMMARY OF THE INVENTION

The present invention has been made in consideration of the above situation and has as its object to provide a semiconductor device of multilayer wiring structure having an insulating interlayer of flat surface wherein variations in the electrical characteristics caused by using polyimide resin for the multilayer wiring structure can be decreased.

It is another object of the present invention to provide a semiconductor device of a multilayer wiring structure wherein the variations in the electrical characteristics are decreased, step coverage is improved and stress is decreased, thereby decreasing wiring disconnection, and improving interlayer insulation performance and humidity resistance.

It is still another object of the present invention to provide a method of manufacturing a semiconductor device wherein an opening of moderately inclined wall surfaces can be easily formed in an insulating interlayer of a multilayer wiring structure to decrease the variations in the electrical characteristics.

According to an aspect of the present invention, there is provided a semiconductor device of a multilayer wiring structure which comprises an insulating interlayer consisting of an inorganic insulating layer as an underlying layer and a polyimide-based resin film as an overlying layer, the ratio of a thickness of said polyimide-based resin film to that of said inorganic insulating film falling within a range between 0.5 and 0.1.

According to another aspect of the present invention, there is provided a method of manufacturing a semiconductor device, characterized by comprising the steps of:

forming an inorganic insulating film to cover a first wiring layer formed on a semiconductor substrate;

etching, by a chemical dry etching method, a predetermined portion of said inorganic insulating film to form a first opening therein;

depositing a polyimide-based resin film on said inorganic insulating film to a thickness falling within a range of 10 to 50% of the thickness of said inorganic insulating film;

etching a portion of said polyimide-based resin film which corresponds to said predetermined portion of said inorganic insulating film to form a second opening in said polyimide-based resin film, said second opening being wider than said first opening; and depositing a second wiring layer such that said second wiring layer is electrically connected to said first wiring layer through said first and second openings.

In still another aspect of the present invention, there is provided a method of manufacturing a semiconductor device, characterized by comprising the steps of:

forming an inorganic insulating film to cover a first wiring layer formed on a semiconductor substrate;

depositing a polyimide-based resin film on said inorganic insulating film to a thickness falling within a range of 10 to 50% of the thickness of said inorganic insulating film;

exposing a portion of said inorganic insulating film by forming a first opening in said polyimide-based resin film by reactive ion etching using a reaction gas which can etch said polyimide-based resin film after forming a photoresist pattern for use as a mask on a predetermined surface area of said polyimide-based resin film;

performing reactive ion etching to form a second opening in said portion of said inorganic insulating film which is exposed through said first opening, by using a reaction gas which can etch said inorganic insulating film; and depositing a second wiring layer such that said second wiring layer is electrically connected to said first wiring layer through said first and second openings.

DETAILED DESCRIPTION OF THE PREFERRED EMBODIMENTS

An inorganic insulating film of the present invention may comprise a single film of silicon nitride or silicon oxide containing nitrogen (silicon oxynitride) which is deposited by a chemical vapor deposition (CVD) method or a plasma CVD method, or may comprise a multilayer structure thereof. It is preferable that the film comprises silicon nitride or silicon oxynitride formed by the plasma CVD method from the viewpoint of interlayer insulation and humidity resistivity. A polyimide-based resin which is preferable in this invention forms a high polymer having an imide skelton on annealing, that is, a polycondensation body derived from pyromellitic dianhydride and aromatic diamine, and has a thermal decomposition temperature of 450° C. or higher. For example, "Semicofine SP510" (tradename: TORAY INDUSTRIES, INC.), "Pyralin" (tradename: du Pont de Nemours) and "PIQ" (tradename: Hitachi Chemical Co., Ltd.) can be used as the polyimide-based resin.

Variations in electric characteristics of a semiconductor device using a polyimide resin as an insulating interlayer after it is kept on for a long period of time have been conventionally attributed to poor resistivity to water and humidity, and to the vulnerability to alkali of the polyimide resin film in comparison with that of an inorganic insulating film. However, the present inventors performed varactor evaluation of the polyimide-based resin which was Bias-Temperature (BT) treated. The obtained results revealed that the variations in the electric characteristics were not caused by contamination with alkali or the like, but were caused by a variation in the surface state charge density (Nss) caused by polarization of the polyimide-based resin itself. In particular, when a line of a negative potential was in a second wiring layer, there was a possibility of causing an inversion at a substrate surface by the variation of Nss.

The variations in the electrical characteristics cannot be eliminated simply by using the inorganic insulating layer. It has been found that the thickness of the polyimide-based resin film must be 50% or less of that of the inorganic insulating layer so that the value $\Delta$Nss could be lower than a target value (i.e., $2 \times 10^{11}$ cm$^{-2}$) after the BT treatment.

Figure 1:
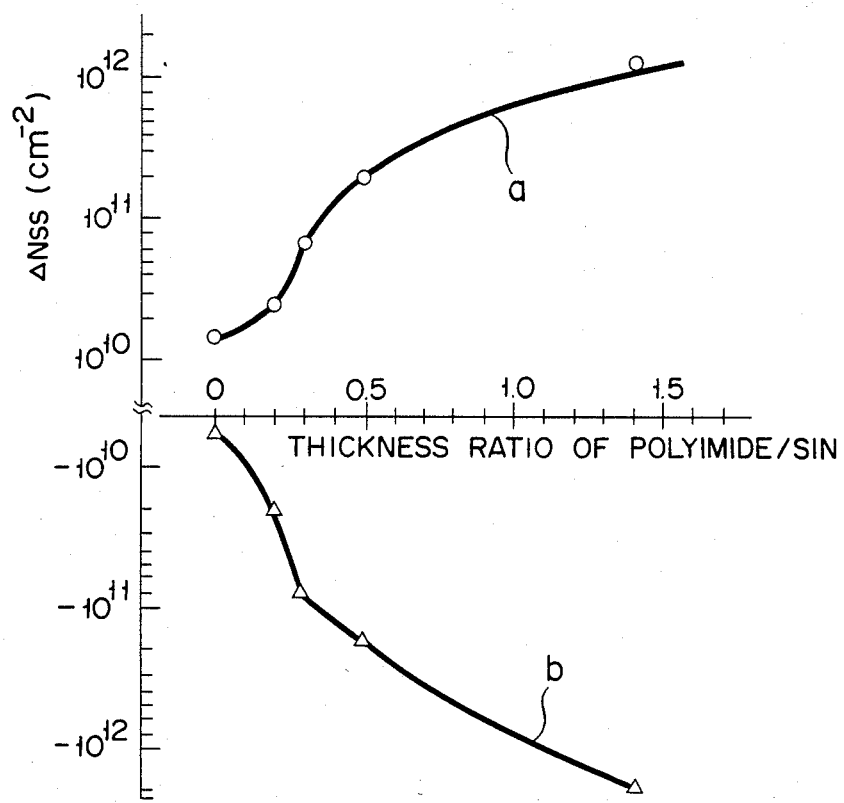
FIG. 1 is a graph for expaining the stabilization of the electric characteristics of a semiconductor device of the present invention.

FIG. 1 is a graph showing a relationship between a thickness ratio (abscissa) and $\Delta$Nss (ordinate). This relationship was determined in the following manner. The ratio of the thickness of the polyimide-based film (e.g., "Semicofine SP510") was varied between 0 and 1.4 with respect to a thickness of 0.21 $\mu$m of a $Si_3N_4$ film (a plasma CVD silicon nitride film of a refractive index of 2.0) so as to obtain a value for Nss by varactor evaluation (in this case, both films were deposited on a thermal oxidation $SiO_2$ film having a thickness of 0.10 $\mu$m), and then the BT treatment was performed at a bias of 0.5 MV/cm at 200° C. for 10 minutes. Curve "a" depicts results after +BT treatment and curve "b", results after −BT treatment.

It is apparent from FIG. 1 that when the thickness ratio is set at 0.5 or less, $\Delta$Nss becomes the target value $2 \times 10^{11}$ cm$^{-2}$ or less. In particular, it is preferable that the thickness ratio be 0.3 or less in order to obtain a substantially stable state.

FIG. 1 simply shows a relationship between the thickness ratio and $\Delta$Nss for the silicon nitride film and the polyimide-based resin film. However, when the ratio of the thickness of a film of "Semicofine SP510" was varied between 0 and 1.4 with respect to a SiON film (a plasma CVD silicon oxynitride film of a refractive index of 1.50 or 1.70) of a thickness of 0.21 $\mu$m, the curves of this case coincided with those of the silicon nitride film. Therefore, it has been found that polarization is caused by the polyimide-based resin film and any inorganic film could be used if the thickness ratio thereof is selected to be 0.5 or less.

On the other hand, the thickness ratio must be 0.1 or higher, or preferably 0.2 or higher in order to obtain good step coverage. The inorganic insulating film such as silicon nitride film is generally formed to have a thickness of 0.5 to 1.5 $\mu$m. Therefore, it is particularly preferable that the polyimide-based resin film has a thickness of 0.1 to 0.6 $\mu$m (or 20 to 60% with respect to that of the inorganic insulating film). When a commercially available polyimide resin having a viscosity of 10 poise is diluted with dimethylacetoamide or the like to have a viscosity of 5 centipoise, it can be deposited to have a thickness of 0.6 $\mu$m. When the resin is diluted to have a viscosity of 10 centipoise, it can be deposited to have a thickness of 0.30 $\mu$m.

Next, a two-step opening forming method and a single step opening forming method will be described as methods according to the present invention for forming an opening in an insulating film which is formed by depositing an inorganic insulating film and a polyimide-based resin film in order to electrically interconnect the electrode wirings of a multilayer wiring structure.

In the two-step opening forming method, an inorganic insulating film is deposited on a first electrode wiring layer and etched by chemical dry etching (ion etching or reactive ion etching). Then, a polyimide-based resin film is deposited on the inorganic insulating film and is etched by chemical dry etching to form a larger opening than the inorganic insulating film opening. Therefore, an inclination of shoulder portion of the opening in the insulating film can be moderated.

In the single step opening forming method, a desired mask is formed by depositing an aluminum film on an insulating film which is formed by depositing a polyimide-based resin film on an inorganic insulating film. Then, the uppermost polyimide-based resin film is etched by reactive ion etching using $O_2$ as a reaction gas. The underlying inorganic insulating film is etched by reactive ion etching using a gas mixture of $CF_4$ and $O_2$. Therefore, an opening can be formed to have a moderately inclined angle of 60° to 70°.

In carrying out a chemical dry etching of polyimide resin film, a reactive gas having a good etching selectivity such as $O_2$ or $CF_4/O_2$ may be employed. On the other hand, in a chemical dry etching step of inorganic insulating film a reactive gas having a good etching selectivity such as $CF_4/O_2$, $CF_6/O_2$ or $CF_4/H_2$ may be employed.

An embodiment of a semiconductor device and a manufacturing method thereof according to the present invention will now be described with reference to the accompanying drawings.

Figure 2:
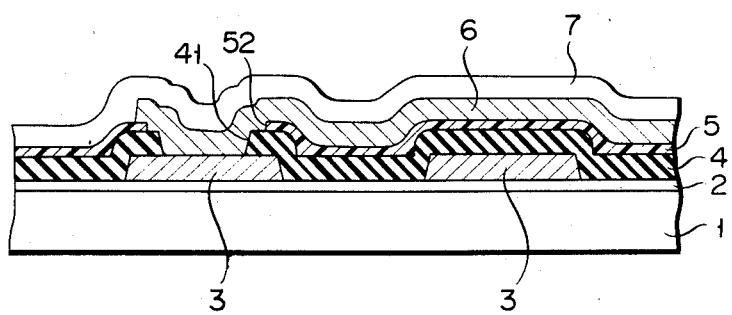
FIG. 2 is a cross-sectional view showing a multilayer wiring structure of a semiconductor device of the present invention.

In FIG. 2, reference numeral 1 denotes a semiconductor substrate having an element formed therein; 2, an $SiO_2$ insulating film formed on the substrate surface and having an opening formed therein for electrically connecting a first electrode wiring layer 3 to the element, the first electrode wiring layer 3 having a thickness of about 1 μm and comprising, for example, an Al-1% Si-2% Cu alloy; 4, a silicon nitride film (serving as an insulating interlayer) deposited on the first electrode wiring layer 3 to a thickness of 1 μm by a plasma CVD method; 5, a polyimide-based resin film (also serving as an insulating interlayer) deposited on the silicon nitride film 4 to a thickness of 0.35 μm; 6, a second electrode wiring layer of an Al-2% Cu alloy or the like; 41 and 52, insulating film openings for electrically connecting the second electrode wiring layer 6 to the first electrode wiring layer 3; and 7, a passivation film such as a silicon nitride film or a polyimide-based resin film formed on the second electrode wiring layer 6.

In the multilayer wiring structure of the present invention (e.g., the structure of FIG. 2), insulation performance and humidity resistance between the wiring layers are maintained by the inorganic insulating film 4. Flattening of the step and decrease of stress acting on the underlying layer are ensured by the polyimide-based resin film 5. Furthermore, the ratio of the thickness of polyimide-based resin film 5 to that of the inorganic insulating layer is 0.5 or less, so that polarization of the insulating interlayer is decreased to a level below a predetermined value. Therefore, a semiconductor device having less variation in electrical characteristics can be obtained.

EXAMPLE 1

An example of a single opening forming method will now be described referring to FIGS. 3(A) to 3(F).

Figure 3A:
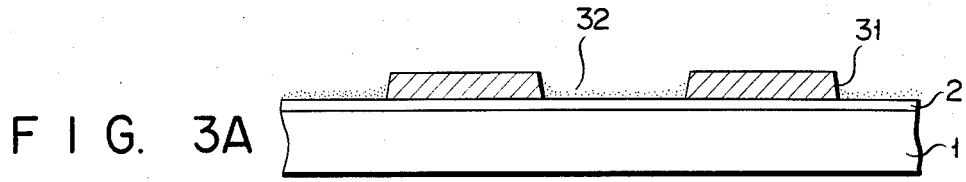
FIGS. 3(A) to 3(F) are views for explaining the steps of a method of forming a two-step opening.

In FIG. 3(A), a thermal oxide film 2 is formed on a semiconductor substrate 1 forming a desired element therein, and is etched by a PEP (plasma etching process) method. Thereafter, an Al-1% Si-2% Cu alloy film is deposited by sputtering on the substrate 1 which is heated at a temperature of 200° to 400° C. The alloy film is selectively etched by a solution mixture of phosphoric acid, acetic acid, nitric acid and water to form a first electrode wiring layer 3.

Figure 3B:
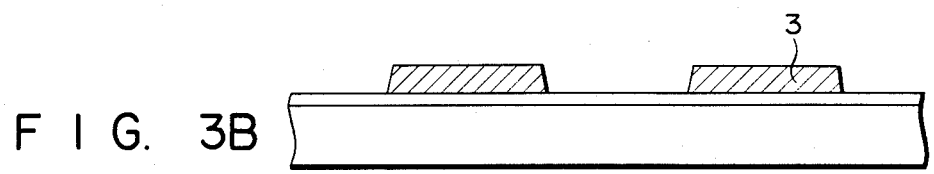

Then, residual silicon 32 remaining after etching is removed by plasma etching using a gas mixture of $CF_4$ and $O_2$, as shown in FIG. 3(B). Thereafer, the resultant substrate is annealed to form a contact of the first electrode wiring layer 3 in an atmosphere of nitrogen at a temperature of 500° C. for 15 minutes.

Figure 3C:
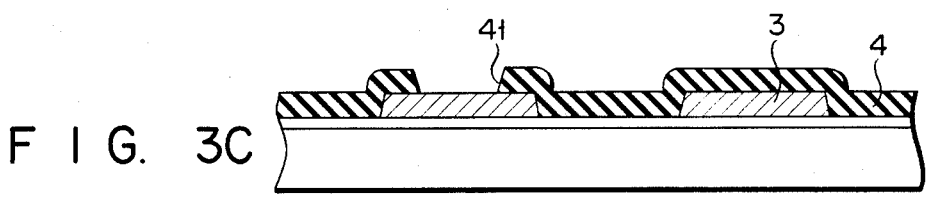

A silicon nitride film 4 of a thickness of 1 μm is deposited on the resultant substrate under conditions of a gas composition of $SiH_4$ and 12% or less of $NH_3$ and at a temperature of 350° to 400° C. by a plasma CVD apparatus (e.g., AMP3300, GL450 or the like), as shown in FIG. 3(C). Then, the film 4 is etched to form an opening 41 by chemical dry etching using a gas mixture of $CF_4$ and $O_2$ (by using a CDE apparatus available from TOKUDA SEISAKUSHO, at a flow rate ratio of three volume of $CF_4$ to one volume of $O_2$, a pressure of 50 Pa, an output of 450 W, and a frequency of 2,450 MHz). The etching rate is 1800 Å/min, so that the above process takes about 6 minutes. A photoresist film used as a mask is peeled off by an oxide plasma asher.

Figure 3D:
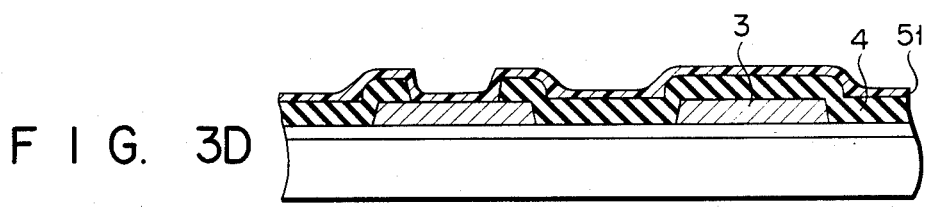

Next, "Semicofine SP510" diluted with dimethylacetoamide to a viscosity of 100 cp is coated by a spin coater on the silicon nitride film 4 at a speed of 4,000 rpm, as shown in FIG. 3(D). Then, three-step annealing is performed in an atmosphere of nitrogen (at a temperature of 100° C. for 60 minutes, at 250° C. for 60 minutes, and at 350° C. for 60 minutes). As a result, the resultant resin film is substantially completely hardened to form a polyimide-based resin film 51 having a thickness of 0.35 μm.

Figure 3E:
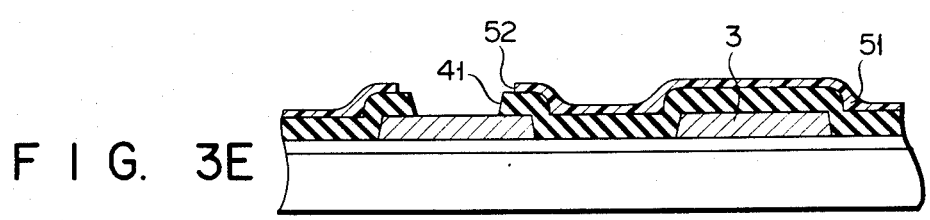

As shown in FIG. 3(E), the resultant polyimide-based resin film 51 is etched to form a opening 52 having a side longer by a length of 1 to 2 μm than that of the opening 41 of the silicon nitride film 4 by chemical dry etching (at a flow rate ratio of three volume of $CF_4$ to one volume of $O_2$, and other conditions being the same as those of the silicon nitride film opening). The etching rate is about 800 Å/min and so the above process takes about 4 minutes. A photoresist film used as a mask is etched at the same time. However, if the photoresist fim has a thickness of 1 μm or more, it can be satisfactorily used as a mask. The photoresist film is peeled off by a peeling solution (i.e., Type 502 available from TOKYO OKA KOGYO) at a temperature of 120° C. for 4 minutes.

Figure 3F:
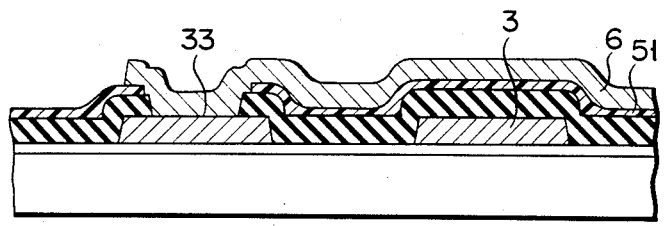

Then, as shown in FIG. 3(F), an Al-2.0% Cu alloy is deposited on the resultant substrate by sputtering and is selectively etched. Then, annealing at a temperature of 450° C. for 15 to 30 minutes is performed to form a second electrode wiring layer 6. Furthermore, a plasma CVD silicon nitride film 7 is formed as a passivation film, and therefore a multilayer wiring structure is formed.

EXAMPLE 2

A two-step opening forming method will be described with reference to FIGS. 4(A) to 4(C).

The process for forming a first electrode wiring layer is the same as in Example 1 (i.e., FIGS. 3(A) and 3(B)).

Figure 4A:
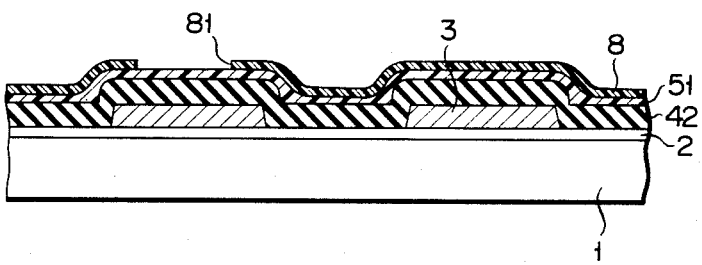
FIGS. 4(A) to 4(C) are views for explaining the steps of a method of forming a single step opening.
Figure 4B:
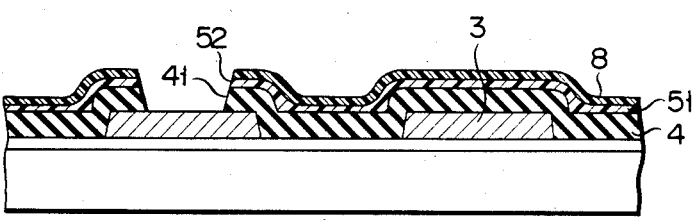

Then, in FIG. 4(A), a silicon nitride film 42 and a polyimide-based resin film 51 are sequentially formed under the same conditions as in Example 1. An Al film 8 as a mask for an insulating layer opening is deposited on the resin film 51 by a deposition method and is selectively etched to form an opening 81.

One of parallel-plate type electrodes (area: 1,500 cm$^2$) is held by the substrate, and the other one thereof is grounded. Then, reactive ion etching (at a frequency of 13.56 MHz, a pressure of 4 Pa, and an output of 200 W) using a reaction gas consisting only of O$_2$ is performed to form an opening 52, as shown in FIG. 4(B). The etching time of the polyimide-based resin film of thickness 0.35 μm is about 4 minutes. Then, the silicon nitride film 42 is etched to form an opening 41 by reactive ion etching (at a flow rate ratio of five volume of CF$_4$ to one volume of O$_2$, a pressure of 10 Pa, and an output of 600 W) using a gas mixture of CF$_4$ and O$_2$. In this case, the Al film 8 does not become overhung, and steps of the Al, polyimide and silicon nitride layers could be formed at an inclined angle of 60° to 70°.

Figure 4C:
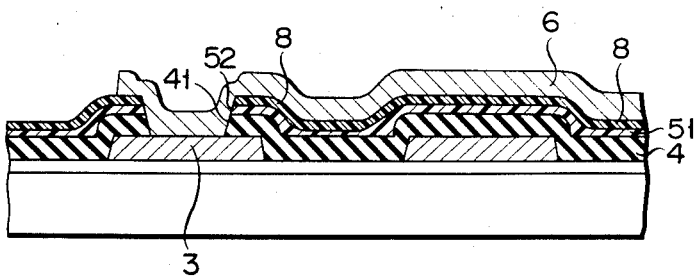

After forming the insulating layer opening, an Al-2.0% Cu alloy is deposited to a thickness of 1.3 μm on the resultant substrate by sputtering, as shown in FIG. 4(C). In this case, it is preferable to perform sputtering by heating the substrate to a temperature of 200° to 400° C. immediately before sputtering or during sputtering, such that the alloy is completely deposited in the openings 41 and 52 having relatively steep slopes. In this case, it is deposited at a substrate temperature of 300° C. and a deposition rate of 10,000 Å/min.

Immediately before the deposition of the second electrode wiring layer, a surface portion of the first electrode wiring layer exposed through the openings has been oxidized to a depth of about 100 to 200 Å, thereby presenting a danger of a conduction defect. Then, it is preferable to perform physical etching (by using a parallel-plate type apparatus at a pressure of 10 Pa, a power density of 1.3 W/cm2' an etching rate of about 60 Å/min and for an etching time of 2 to 3 minutes) on the entire surface of the substrate to remove the oxide by using ions of an inert gas such as Ar immediately before the deposition of the second electrode wiring layer.

According to a semiconductor device and manufacturing method thereof of the present invention, the following effects can be obtained:

(I) Since a polyimide-based resin film has a thickness ratio of 0.5 or less with respect to the thickness of an inorganic insulating film, variations of the electrical characteristics caused by polarization of the polyimide-based resin film can be significantly decreased.

(II) Since the polyimide-based resin film has a thickness ratio of 0.1 or more with respect to the thickness of the inorganic insulating film, effective flattening of the polyimide-based resin film can be realized.

(III) Since the inorganic insulating film and the polyimide-based resin film are multilayered, a semiconductor device can be obtained, in which interlayer insulation and humidity resistance of the inorganic insulating film and step coverage of the polyimide-based resin film are improved and an interface stress is decreased.

(IV) Openings formed in an insulating film have a small step, so a semiconductor device without a disconnection can be easily obtained.

What is claimed is:

1. A semiconductor device having a multilayer wiring structure which comprises a semiconductor substrate, a first wiring layer deposited on said substrate, and a second wiring layer deposited on said first wiring layer with an insulating interlayer disposed therebetween, wherein said insulating interlayer consisting essentially of an inorganic insulating layer as an underlying layer and a polyimide-based resin film as an overlying layer, wherein said inorganic insulating film has a thickness falling within a range between 0.5 μm and 1.5 μm, the ratio of a thickness of said polyimide-based resin film to that of said inorganic insulating film falling within a range between 0.1 and 0.5.

2. A device according to claim 1, wherein said inorganic insulating film comprises a film selected from the group consisting of a silicon nitride film, a nitride-containing silicon oxide film, and a multilayer film thereof.

3. A device according to claim 2, wherein said inorganic insulating film comprises a chemical vapor deposition film.

4. A device according to claim 2, wherein said inorganic insulating film comprises a plasma chemical vapor deposition film.

5. A device according to claim 1, wherein said inorganic insulating film has a thickness falling within a range between 0.5 μm and 1.5 μm.

6. A device according to claim 1, wherein the ratio of a thickness of said polyimide-based resin film to that of said inorganic insulating film ranges between 0.2 and 0.4.

7. A device according to claim 1, wherein the polymide-based resin has a thermal decomposition temperature of 450° C. or more.

* * * * *